(12) United States Patent
Yavelberg

(10) Patent No.: US 9,339,914 B2
(45) Date of Patent: May 17, 2016

(54) SUBSTRATE POLISHING AND FLUID RECYCLING SYSTEM

(71) Applicant: Applied Materials, Inc., Santa Clara, CA (US)

(72) Inventor: Simon Yavelberg, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 55 days.

(21) Appl. No.: 14/021,942

(22) Filed: Sep. 9, 2013

(65) Prior Publication Data

US 2014/0069890 A1    Mar. 13, 2014

Related U.S. Application Data

(60) Provisional application No. 61/698,885, filed on Sep. 10, 2012.

(51) Int. Cl.
*B24B 37/34* (2012.01)
*B24B 57/02* (2006.01)
*H01L 21/67* (2006.01)

(52) U.S. Cl.
CPC ............... *B24B 37/34* (2013.01); *B24B 57/02* (2013.01); *H01L 21/67242* (2013.01)

(58) Field of Classification Search
USPC .......................... 156/345.12, 345.15
See application file for complete search history.

(56) References Cited

U.S. PATENT DOCUMENTS

| | | | | |
|---|---|---|---|---|
| 7,137,879 B2* | 11/2006 | Chen et al. | ..................... | 451/548 |
| 8,578,953 B2* | 11/2013 | Takiguchi et al. | ............ | 134/149 |
| 2003/0164356 A1* | 9/2003 | Tanaka et al. | ................... | 216/89 |
| 2011/0240220 A1* | 10/2011 | Schoeb | ..................... | 156/345.14 |
| 2014/0069890 A1* | 3/2014 | Yavelberg | ....................... | 216/53 |

* cited by examiner

*Primary Examiner* — Sylvia R MacArthur
(74) *Attorney, Agent, or Firm* — Patterson & Sheridan, LLP

(57) ABSTRACT

Embodiments of the present invention are generally directed to a substrate polishing and slurry recycling system. The system includes an extendable gutter that may be positioned to collect processing slurry from the polishing pad during processing and deliver the consumed slurry to a reclamation tank. The reclaimed slurry may be treated and mixed with fresh slurry for delivery to the polishing pad during subsequent substrate polishing. The extendable gutter may be positioned in a second position during rinsing of the polishing pad so that rinsing fluid passes underneath the gutter and is removed from the system without mixing with the reclaimed slurry.

19 Claims, 2 Drawing Sheets

SUBSTRATE POLISHING AND FLUID RECYCLING SYSTEM

CROSS-REFERENCE TO RELATED APPLICATIONS

This application claims benefit of U.S. Provisional Application Ser. No. 61/698,885, filed Sep. 10, 2012, of which is incorporated by reference in its entirety.

BACKGROUND OF THE INVENTION

1. Field of the Invention

Embodiments of the present invention generally relate to a polishing and fluid recycling system used for chemical mechanical polishing of substrates.

2. Description of the Related Art

In the fabrication of integrated circuits and other electronic devices, multiple layers of conducting, semiconducting, and dielectric materials are deposited on or removed from a surface of a substrate. As layers of materials are sequentially deposited and removed, the uppermost surface of the substrate may become non-planar across its surface and require planarization. Chemical mechanical planarization, or chemical mechanical polishing (CMP), is a common technique used to planarize substrates. CMP utilizes a chemical composition, typically a processing slurry, for selective removal of material from substrates. However, during CMP a significant volume of processing slurry is flushed out of the system prior to even reaching the substrate. As the cost of processing slurry is a high consumable for substrate processing, there is a need for an improved system to minimize the loss of processing slurry and/or maximize the reuse of processing slurry.

SUMMARY OF THE INVENTION

In one embodiment of the present invention, a processing apparatus comprises a substrate platen configured to support a polishing material disposed thereon, an extendable gutter disposed about the platen for collecting fluid leaving the polishing material during a processing operation when the extendable gutter is positioned in a first position, and an actuator operable to move the extendable gutter from the first position to a second position in which fluid leaving the polishing material during a rinsing operation bypasses the extendable gutter.

In another embodiment, a method of substrate processing comprises positioning an extendable gutter in a first position about a polishing pad such that fluid leaving the polishing pad is collected in the extendable gutter while polishing a substrate and positioning the extendable gutter in a second position such that fluid removed from the polishing pad during a rinsing operation bypasses the extendable gutter.

In yet another embodiment, an apparatus for use in a chemical mechanical polishing apparatus comprises a gutter configured to be disposed about a rotatable platen configured to support a polishing material for collecting fluid leaving the polishing pad during a processing operation, and an actuator coupled to the gutter and operable to change the gutter between a first state that preferentially collects polishing fluid leaving the polishing material due to rotation of the platen and a second state that allows fluids leaving the polishing material due to rotation of the platen to bypass the gutter.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION

Embodiments of the present invention are generally directed to a substrate polishing and slurry recycling system. The system includes an extendable gutter that may be actuated between states that preferentially collect processing slurry relative to other fluids from a polishing material during processing. The collected slurry may be treated and mixed with fresh slurry for delivery to the polishing material during subsequent substrate polishing. The extendable gutter may be actuated to a different state during rinsing of the polishing material in which rinsing fluid leaving the polishing material bypasses the gutter and is removed from the system without mixing with the collected slurry.

Figure 1:
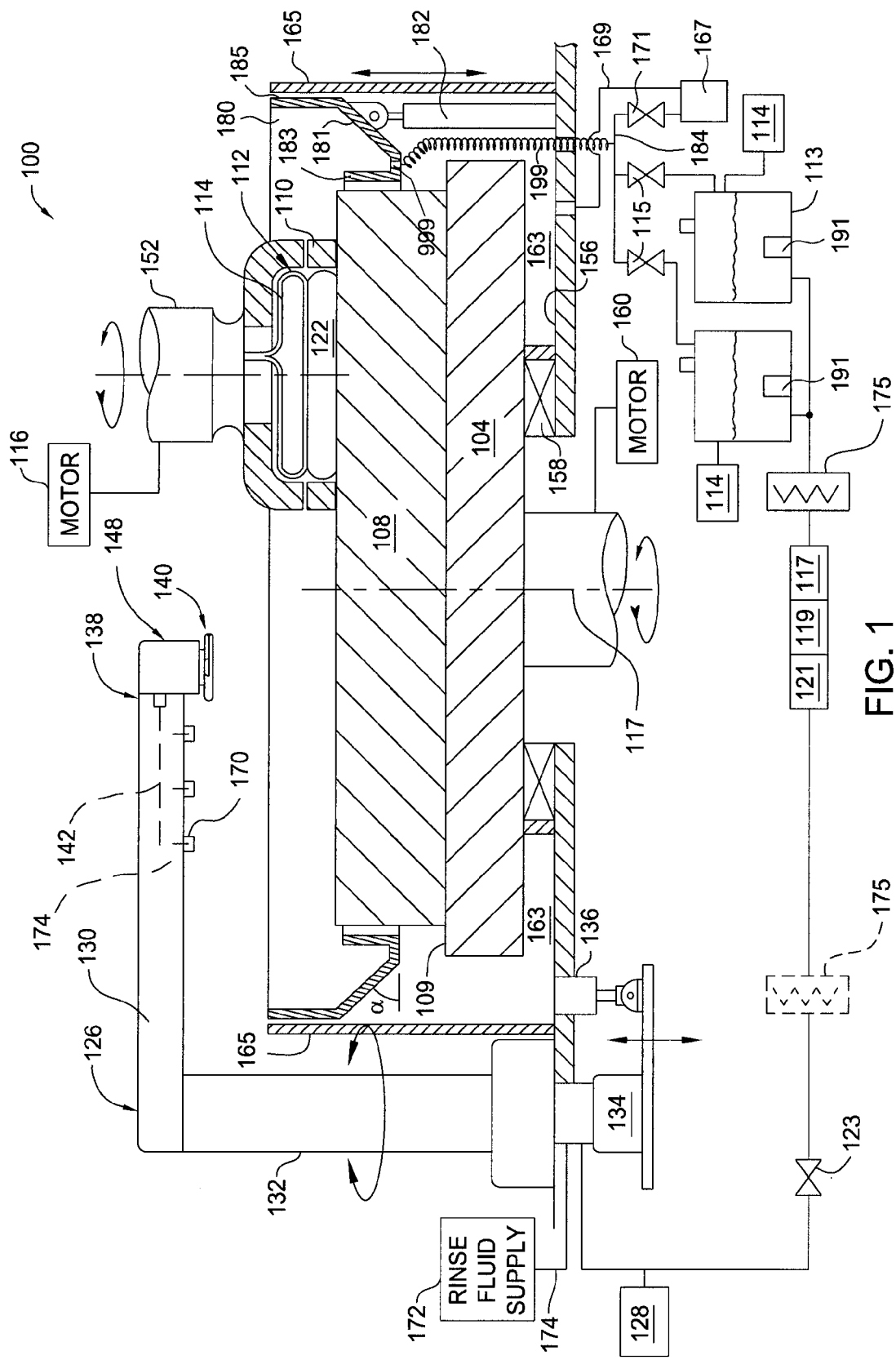
FIG. 1 depicts a sectional view of one embodiment of a processing apparatus during chemical mechanical processing of a substrate.

FIG. 1 depicts a sectional view of one embodiment of a processing apparatus 100 during processing of a substrate 122. As used herein, processing includes, but is not limited to, planarizing, polishing, and/or buffing operations. The processing apparatus 100 generally includes a carrier head assembly 152, a rotatable platen 104, and a fluid delivery arm assembly 126. The carrier head assembly 152 generally retains the substrate 122 against polishing material, or a polishing pad 108, disposed on the platen 104. At least one of the carrier head assembly 152 and the platen 104 is rotated or otherwise moved to provide relative motion between the substrate 122 and the polishing pad 108 during processing. In the embodiment shown in FIG. 1, the carrier head assembly 152 is coupled to an actuator or motor 116 that provides at least rotational motion to the substrate 122. The motor 116 may also oscillate the carrier head assembly 152, such that the substrate 122 is moved laterally back and forth across the surface of the polishing pad 108. In addition, the carrier head assembly 152 includes an actuator (not shown) for raising and lowering the substrate 122.

The carrier head assembly 152 may include a retaining ring 110 circumscribing a substrate receiving pocket 112. A bladder 114 is disposed in the substrate receiving pocket 212 and may be evacuated to chuck the substrate 122 to the carrier head assembly 152 and pressurized to control the downward force of the substrate 122 when pressed against the polishing pad 108 during processing.

The platen 104 is supported on a base 156 by bearings 158 that facilitate rotation of the platen 104. A motor 160 is coupled to the platen 104 and rotates the platen 104 such that the pad 108 is moved relative to the carrier head assembly 152.

The fluid delivery arm assembly 126 is utilized to deliver a chemical processing slurry from a processing slurry supply 128 and/or a rinsing fluid to the surface of the polishing pad 108. The fluid delivery arm assembly 126 includes an arm 130 extending from a stanchion 132. A motor 134 is provided to control the rotation of the arm 130 about a center line of the stanchion 132. An adjustment mechanism 136 may be provided to control the elevation of a distal end 138 of the arm 130 relative to the surface of the polishing pad 108. The adjustment mechanism 136 may be an actuator, such as a pneumatic cylinder, coupled to at least one of the arm 130 and the stanchion 132 for controlling the elevation of the distal end 138 of the arm 130 relative to the platen 104.

The fluid delivery arm assembly 126 may include a plurality of rinse outlet ports 170 arranged to uniformly deliver a spray of rinsing fluid to the surface of the polishing pad 108. The ports 170 are coupled by a tube 174 routed through the fluid delivery arm assembly 126 to a rinsing fluid supply 172. The rinsing fluid supply 172 may provide a rinsing fluid, such as deionized water, to the polishing pad 108 after the substrate 122 is removed to clean the polishing pad 108.

The fluid delivery arm assembly 126 further includes a nozzle assembly 148 disposed at the distal end of the arm 130. The nozzle assembly 148 is coupled to a fluid supply 128 by a tube 142 routed through the fluid delivery arm assembly 126. The nozzle assembly 148 includes a nozzle 140 that may be selectively adjusted to deliver a chemical processing slurry to the surface of the polishing pad 108 during polishing of the substrate 122. In one embodiment, the fluid delivery arm assembly 126 may be configured to deliver rinsing fluid through the nozzle assembly 148 in addition to or in lieu of the rinse outlet ports 170.

The processing apparatus 100 further includes an extendable gutter 180 supported by the base 156 via an actuator 182, such as a lead screw, hydraulic or pneumatic cylinder, linear actuator, or other suitable device. The extendable gutter 180 may be actuated by an actuator 182 between a first state that preferentially collects polishing fluid leaving the polishing pad 108 due to rotation of the platen 104 in the gutter 180 and a second state that causes rinsing fluid leaving the polishing pad 108 to bypass the gutter 108. The change in states may be caused by opening and closing apparatus that allow fluid into the gutter 180, moving a shield between positions that block and allow fluid into the gutter 180, controlling the elevation of the gutter relative to the platen 104, or other suitable manner. In the embodiment of FIG. 1, the actuator 182 controls the elevation of the gutter 180 relative to the platen 104.

In one embodiment, the extendable gutter 180 is a cylindrical, ring-shaped member having a base section 181 with a first wall 183 and a second wall 185 extending from the base section 181. In one embodiment, the extendable gutter 180 may have a cross-section that substantially forms a "C" section. Alternatively, the extendable gutter 180 may have a cross-section that substantially forms a "U" section. Regardless of the exact shape of the extendable gutter 180, the cross-sectional shape of the extendable gutter is generally shaped to collect and drain fluid that is forced from the polishing pad 108 during substrate processing.

In one embodiment, the base section 181 may be positioned horizontally, i.e., parallel to an upper surface 109 of the platen 104, or as shown in FIG. 1, the base section 181 may be configured at an angle α with respect to the upper surface 109 of the platen 104. In one example, the angle α may be between about 20° and about 70°, such as between about 35° and about 55°, with respect to the upper surface 109 of the platen 104. One advantage that may be achieved by providing the base section 181 at such an angle is to help ensure that any slurry collected by the extendable gutter 180 adequately drains from the extendable gutter 180. Further, the surfaces of the extendable gutter 180 may be molded or sloped to feed fluid/slurry into individual drain holes 999 formed through the extendable gutter 180. Thus, slurry particles are less likely to collect and dry in the extendable gutter 180, which would require frequent flushing and loss of slurry.

As further shown in FIG. 1, the extendable gutter 180 is movable relative to the platen 104 using the actuator 182. In a first position illustrated in FIG. 1, the extendable gutter 180 is positioned to collect processing slurry that is forced off of the polishing pad 108 due to rotation of the platen 104 during processing of the substrate 122. One or more drain holes 999 formed through the bottom of the extendable gutter 180 are fluidly coupled to a tube 183. The tube 183 is fluidly coupled to a tube 184. One end of the tube 184 is fluidly coupled to a system drain 167 via a shut-off valve 171. The other end of the tube 184 is fluidly coupled to a slurry reclamation tank 113 via a shut-off valve 115. Thus, in operation, the collected processing slurry may be selectively circulated to the slurry reclamation tank 113 for reclamation and further use, or delivered to the system drain 167 for disposal.

At the slurry reclamation tank 113, the pH level (and/or other chemical properties) may be measured and chemicals may be added in order to return the slurry to a desired state (e.g., desired pH level) using a chemical injection device 114. In addition, particle distribution of the slurry may be measured, for example by laser reflectance measurements, in order to ensure adequate particle size and distribution in the reclaimed slurry.

In one embodiment, the slurry reclamation tank 113 may include an agitator 191 to agitate the slurry in the slurry reclamation tank 113 and prevent slurry particles from aggregating or settling in the bottom of the tank. In addition, the slurry reclamation tank 113 may be pressurized, for example with an inert gas such as nitrogen, in order to provide a steady delivery of reclaimed slurry for downstream use.

The slurry reclamation tank 113 is further fluidly coupled with a fluid pump 117, pressure regulator 119, flow controller 121, and a shut-off valve 123 through which the reclaimed slurry may be delivered for mixing with fresh slurry from the processing slurry supply 128. The flow controller 121 may be used to control the amount of reclaimed slurry delivered to be mixed with the fresh slurry in order to control the ratio of reclaimed slurry to fresh slurry delivered to the surface of the polishing pad 108 via the nozzle assembly 148. In the embodiment, in which the slurry reclamation tank 113 is pressurized, the fluid pump 117 may not be needed; rather, the flow controller 121 is used to control the amount of reclaimed slurry delivered to it due to the pressurization from the slurry reclamation tank 113. Any mixture of reclaimed to fresh slurry may be delivered to the nozzle assembly 148 for dispensing onto the pad 108 during processing.

In one embodiment, a second slurry reclamation tank 192 may be coupled in to the system as well. The second slurry reclamation tank 192 may be similar to the slurry reclamation tank 113 and may either function in parallel or as a back up to the slurry reclamation tank 113, particularly during periodic maintenance of the slurry reclamation tank 113. For instance, the slurry reclamation tank 113 may need periodic flushing and cleaning. During these maintenance periods, the second slurry reclamation tank 192 may function as the main tank, while the slurry reclamation tank 113 is taken off-line for maintenance. Thus, in the dual tank system, periodic maintenance can be performed without shutting down operation of the processing system.

Figure 2:
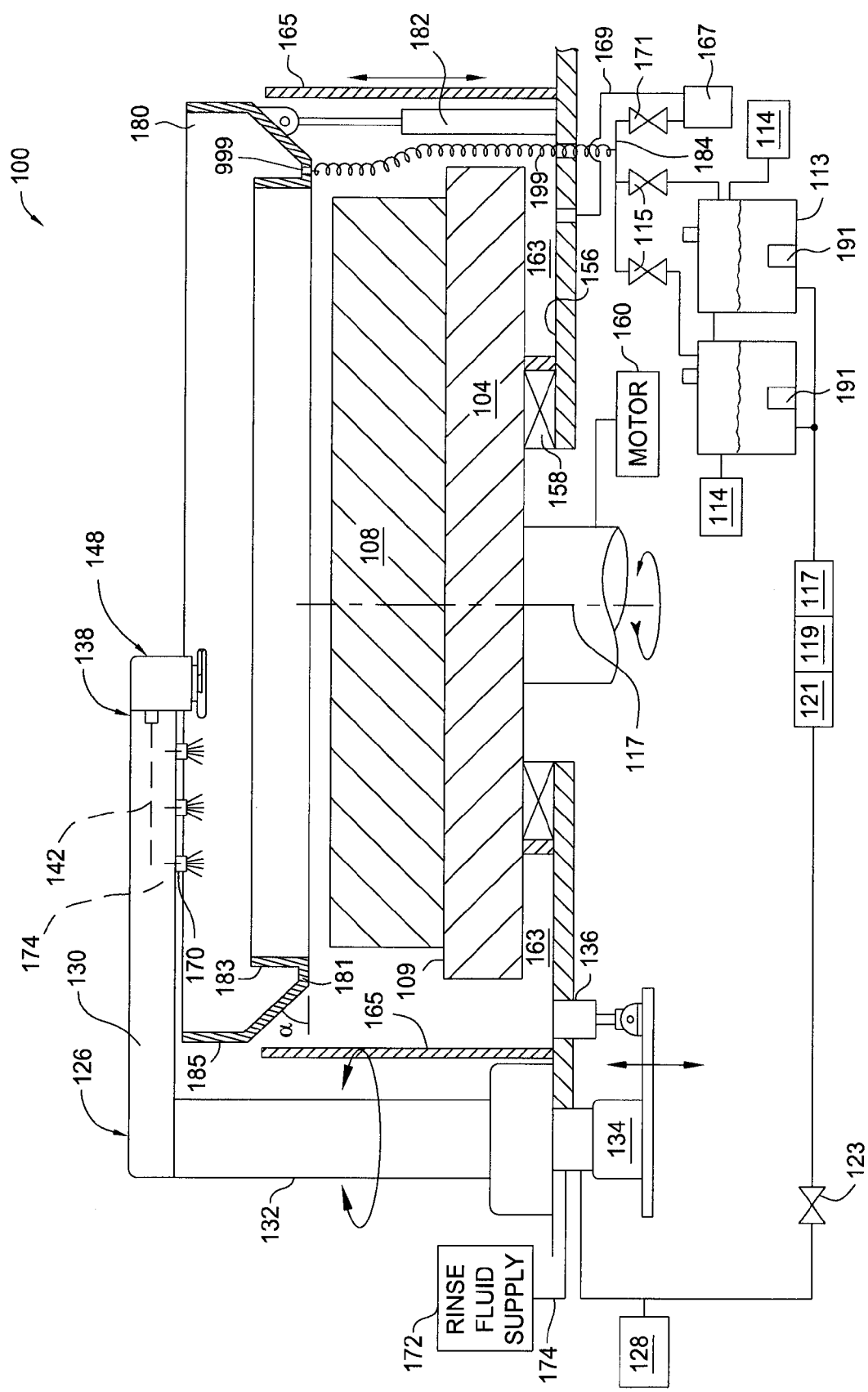
FIG. 2 depicts the processing apparatus of FIG. 1 during a rinsing or cleaning process after the substrate has been processed.

FIG. 2 depicts the processing apparatus 100 during a rinsing or cleaning process after the substrate 122 has been processed. In this configuration, the carrier head assembly 152 is raised so that the substrate 122 is not in contact with the polishing pad 108. Note, the carrier head assembly 152 is not shown in FIG. 2 for clarity. During the rinsing process, the extendable gutter 180 is raised via the actuator 182. Accordingly, rinsing fluid that is applied to the surface of the polishing pad 108 via the rinse outlet ports 170 is forced off of the polishing pad 108 due to the rotation of the platen 104, passes underneath the extendable gutter 180, and is not collected by the extendable gutter 180. In other embodiments, the extendable gutter 180 may be lowered such that rinsing fluid passes over the extendable gutter 180 such that fluid does not collect in the extendable gutter 180.

A catch basin 163 may be formed on the base 156 via a cylindrical wall 165. The catch basin 163 is fluidly coupled to the drain 167 through a tube 169. As shown in FIG. 2, during rinsing of the polishing pad 108, the catch basin 163 collects rinsing fluid that is forced off of the polishing pad 108 and bypasses the extendable gutter 180, and the collected rinsing fluid is ultimately routed to the drain 167. Thus, by positioning the extendable gutter 180 at an elevation relative to the platen 104, which causes rinsing fluid to bypass the gutter 180 when leaving the pad 108 due to the rotation of the platen 104, the rinsing fluid is not mixed with the processing slurry that is collected by the extendable gutter 180 during polishing of the substrate 122.

During operation of the processing apparatus 100, and referring to FIG. 1, the carrier head assembly 152 first positions the substrate 122 over the polishing pad 108. The extendable gutter 180 may then be positioned using the actuator 182 into a processing position, directly outward and surrounding the polishing pad 108, as shown in FIG. 1. The carrier head assembly 152 may then be lowered toward the polishing pad 108 to place the substrate 122 in contact with the polishing pad 108, and a processing slurry may be applied to the surface of the polishing pad 108 using the nozzle assembly 148. A chemical mechanical polishing process may be performed on the substrate 122 with the substrate 122 in contact with the polishing pad 108.

As discussed above, during the mechanical polishing process, processing slurry is forced from the processing pad 108 by the rotation of the platen 104 and collected in the extendable gutter 180. The collected processing slurry may then be drained into the slurry reclamation tank 113 through the tube 184 and valve 115. In the slurry reclamation tank 113, pH of the slurry may be measured, and chemicals added, via the chemical injection device 114, as needed to attain the desired pH of the slurry. In addition, the particle size and distribution may be measured to confirm they are within appropriate specifications.

A filter 175 may be utilized to remove suspended solids larger than a particle size for which the filter is rated from the slurry. The filter 175 may be a mechanical or physical operation used for separating of solids from slurry by interposing a medium through which predominantly only the slurry may pass through. In one embodiment, the filter 175 may be disposed between the reclamation tank 113 and the fluid pumps 117. In alternative embodiment, the filter may be disposed between the flow controller 121 and the shut-off valve 123.

The reclaimed slurry exiting the tank 113 may then be transferred through the valve 123 via the pump 117 for mixing with fresh slurry from the processing slurry supply 128. Alternatively, the reclaimed slurry may be provided from the reclamation tank 113 via pressurization from the tank rather than using the pump 117 as described above. Regardless, the amount of reclaimed slurry delivered for mixing with the processing slurry supply 128 may be controlled using the flow controller 121. The mixture of fresh slurry from the processing slurry supply 128 and the reclaimed slurry from the reclamation tank 113 is then delivered through the fluid delivery arm assembly 126 to the nozzle assembly 148 for distribution onto the polishing pad 108 during further polishing of the substrate 122.

Referring primarily to FIG. 2, once the polishing operation is complete, the substrate 122 is removed from the surface of the polishing pad 108 using the carrier head assembly 152. The extendable gutter 180 is then moved to a position relative to the platen 104 which substantially prevents the fluid leaving the polishing pad 108 due to the centrifugal force from collecting in the gutter 180. In the embodiment depicted in FIG. 2, the gutter 180 is raised above the polishing pad 108 using the actuator 182. A polishing pad rinsing operation may then be performed. During the polishing pad rinsing operation, a rinsing fluid, such as deionized water, may be delivered to the surface of the polishing pad 108 via the rinse outlet ports 170. The rinsing fluid is forced off of the surface of the polishing pad 108 due to the rotation of the platen 104. The rinsing fluid leaving the polishing pad 108 is collected in the catch basin 163 and delivered to the drain 167 for disposal.

Further, during at least a portion of the rinsing operation, the extendable gutter 180 may be positioned to catch the rinsing fluid. The rinsing fluid helps flush any remaining slurry from the extendable gutter 180. The rinsing fluid and residual slurry is then delivered from the extendable gutter 180 through the valve 171 to the drain 167 for disposal.

Thus, embodiments of the present invention include substrate polishing system having an extendable gutter that may be positioned to collect processing slurry from the polishing pad during processing and deliver the consumed slurry to a reclamation tank. The reclaimed slurry may be treated and mixed with fresh slurry for delivery to the polishing pad during subsequent substrate polishing. The extendable gutter may be positioned in a second position during rinsing of the polishing pad so that rinsing fluid passes underneath the gutter and is removed from the system without mixing with the reclaimed slurry.

While the foregoing is directed to embodiments of the present invention, other and further embodiments of the invention may be devised without departing from the basic scope thereof, and the scope thereof is determined by the claims that follow.

The invention claimed is:
1. A processing apparatus, comprising:
a substrate platen having a top surface configured to support a polishing material disposed thereon;
an extendable gutter disposed about the platen for collecting fluid leaving the polishing material during a processing operation when the extendable gutter is positioned in a first position;
one or more drain holes formed in a bottom of the extendable gutter, the drain holes fluidly coupled by a tube to a system drain; and
an actuator operable to move the extendable gutter from the first position to a second position where the bottom of the extendable gutter is vertically above the top surface of the substrate platen and in which fluid leaving the polishing material during a rinsing operation for the polishing material bypasses the extendable gutter.

2. The processing apparatus of claim 1, further comprising a fluid reclamation tank in fluid communication with the one or more drain holes formed in the bottom of the extendable gutter for receiving the fluid collected in the extendable gutter.

3. The processing apparatus of claim 2, further comprising:
a pump in fluid communication with the fluid reclamation tank; and a flow controller configured to control the flow of fluid from the pump to the polishing material disposed on the platen.

4. The processing apparatus of claim 3, wherein the pump and the flow control mechanism are further configured to provide a mixture of processing fluid to the polishing material disposed on the platen, wherein a portion of the mixture is from a fresh processing fluid source.

5. The processing apparatus of claim 4, wherein a portion of the mixture is from the fluid reclamation tank.

6. The processing apparatus of claim 1, further comprising a catch basin for collecting processing fluid not collected by the extendable gutter.

7. The processing apparatus of claim 6, wherein the catch basin is fluidly connected to a drain.

8. The processing apparatus of claim 1, wherein the processing fluid is a chemical slurry.

9. The processing apparatus of claim 1, wherein the extendable gutter comprises a base section and two walls extending from the base section.

10. The processing apparatus of claim 9, wherein the base section is configured at an angle of between 20° and 70° with respect to an upper surface of the platen.

11. A method of substrate processing, comprising:
positioning an extendable gutter in a first position about a polishing pad such that fluid leaving the polishing pad is collected in the extendable gutter while polishing a substrate; and
positioning the extendable gutter in a second position such that fluid removed from the polishing pad during a rinsing operation bypasses the extendable gutter, wherein a bottom of the extendable gutter is vertically above a top surface of the polishing pad when the extendable gutter is in the second position.

12. The method of claim 11, further comprising delivering at least a portion of the fluid collected in the extendable gutter to a fluid reclamation tank.

13. The method of claim 12, further comprising measuring at least one of the chemical concentration and the particle distribution of the fluid delivered to the fluid reclamation tank.

14. The method of claim 12, further comprising delivering a mixture of processing fluid to the polishing pad, wherein the mixture comprises a portion of the fluid from the fluid reclamation tank.

15. The method of claim 14, wherein the mixture further comprises a portion of fresh processing fluid from a fresh processing fluid source.

16. The method of claim 11, further comprising:
repositioning the extendable gutter about the polishing pad in the first position such that rinsing fluid from the polishing pad is collected in the extendable gutter; and
draining the rinsing fluid from the extendable gutter.

17. An apparatus for use in a chemical mechanical polishing apparatus, comprising:
a gutter configured to be disposed about a rotatable platen configured to support a polishing material for collecting fluid leaving the polishing pad during a processing operation, wherein one or more drain holes are formed in the gutter and are fluidly coupled by a tube to a system drain; and
an actuator coupled to the gutter and operable to change the gutter between a first state that preferentially collects polishing fluid leaving the polishing material due to rotation of the platen and a second state that allows fluids leaving the polishing material due to rotation of the platen to bypass the gutter, wherein a bottom of the gutter is vertically above a top surface of the rotatable platen when the gutter is in the second state.

18. The apparatus of claim 17, further comprising a fluid reclamation tank coupled to the gutter.

19. The apparatus of claim 18, further comprising:
a pump coupled to the fluid reclamation tank; and
a flow controller configured to control the flow of fluid from the pump to a fluid delivery arm of the chemical mechanical polishing apparatus, wherein the pump and flow control mechanism are further configured to control a ratio of fluid from the reclamation tank and from a fresh processing fluid source delivered to the fluid delivery arm.

* * * * *